(12) United States Patent
Bouisse (10) Patent No.: US 12,470,193 B2
(45) Date of Patent: Nov. 11, 2025

(54) BROADBAND DECOUPLING NETWORK

(71) Applicant: MACOM Technology Solutions Holdings, Inc., Lowell, MA (US)

(72) Inventor: Gerard Bouisse, Saint-Lys (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 189 days.

(21) Appl. No.: 18/371,131

(22) Filed: Sep. 21, 2023

(65) Prior Publication Data

US 2025/0105813 A1   Mar. 27, 2025

(51) Int. Cl.
*H03H 7/06* (2006.01)

(52) U.S. Cl.
CPC ..................... *H03H 7/06* (2013.01)

(58) Field of Classification Search
CPC .. H03H 7/00; H03H 7/01; H03H 7/06; H03H 7/0107; H03H 7/0138; H03H 7/0153

USPC .............. 333/167, 172, 177, 24 R, 24 C
See application file for complete search history.

(56) References Cited

U.S. PATENT DOCUMENTS

| | | | | |
|---|---|---|---|---|
| 6,097,269 A | * | 8/2000 | Hernandez | H03H 7/0115 455/340 |
| 7,442,633 B2 | * | 10/2008 | Bhattacharyya | B82Y 10/00 257/E21.018 |
| 10,014,252 B2 | * | 7/2018 | Chang | H01L 23/53295 |

* cited by examiner

*Primary Examiner* — Hai L Nguyen
(74) *Attorney, Agent, or Firm* — Sage Patent Group (57) ABSTRACT

A decoupling network for a radio frequency (RF) circuit includes a first decoupling capacitor coupled to a decoupling node of the RF circuit, a second decoupling capacitor coupled to the decoupling node of the RF circuit in parallel with the first decoupling capacitor, and an additional resistance in series with the first decoupling capacitor or the second decoupling capacitor.

20 Claims, 8 Drawing Sheets

BROADBAND DECOUPLING NETWORK

FIELD

The present application relates to radio frequency (RF) circuits, and in particular to decoupling networks for RF circuits.

BACKGROUND

RF circuits and devices operate at frequencies above about 30 kHz up to 30 GHz and above. RF circuits and devices are sensitive to noise and interference, which can degrade signal quality and performance. In addition, RF circuits and devices often operate at high frequencies and require a stable DC voltage to function with high linearity. To address these issues, it is known to provide a decoupling network in RF circuits. A decoupling network may be as simple as a decoupling capacitor (also called a bypass capacitor) that is connected to the RF circuit or device and that provides a low impedance path to ground for unwanted RF energy in the circuit.

Decoupling networks may act as low-pass filter to remove high-frequency noise and voltage fluctuations from power supply lines. This may help to maintain a clean and stable DC voltage for the active components in the circuit.

Decoupling networks may perform other functions within an RF circuit. For example, also a decoupling network may provide a local reservoir of energy that can quickly respond to changes in current demand, which may help to reduce voltage droops and ensure that the RF components receive a consistent voltage supply. Decoupling networks may also be used to reduce noise that can be generated by active components of an RF circuit, such as transistors, amplifiers, and oscillators. Decoupling networks can help to isolate individual components in an RF circuit from each other, and can help stabilize the circuit by compensating for variations in temperature and/or manufacturing processes by helping to ensure that the operating conditions remain consistent.

Proper decoupling network design is therefore important for achieving optimal RF circuit operation.

Figure 1:
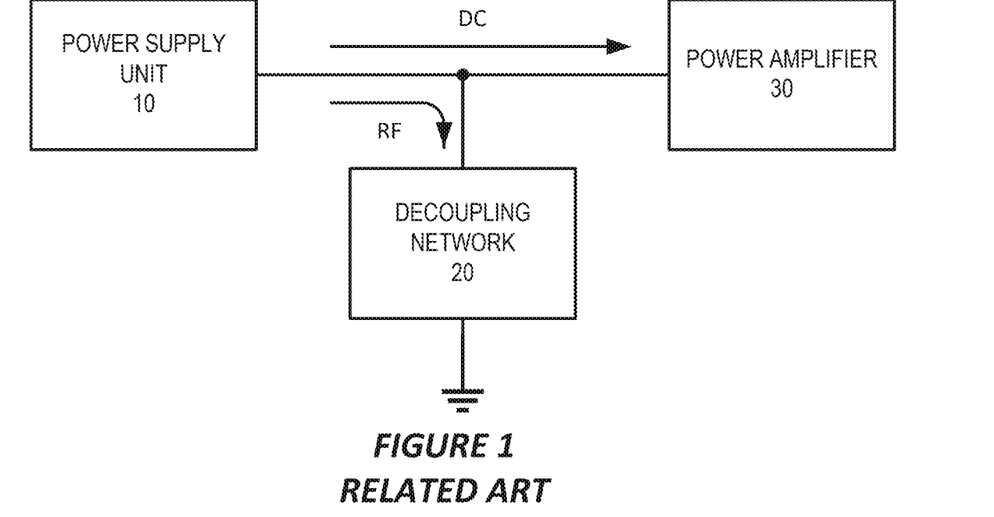
FIG. 1 is a block diagram that illustrates the use of a decoupling network in an RF circuit including a power supply unit and a power amplifier.

FIG. 1 is a block diagram that illustrates the use of a decoupling network 20 in an RF circuit including a power supply unit 10 and a power amplifier 30. Power generated by the power supply unit 10 may include both low frequency (e.g., DC) and high frequency (e.g., RF) energy.

The RF energy present in the power supply voltage may undesirably affect the output of the power amplifier 30 by, for example, undesirably modulating the output signal of the power amplifier 30, which may reduce the bandwidth of the power amplifier 30. A decoupling network 20 is coupled to the power supply line to provide a low impedance path to ground for RF energy in the power supply voltage, while allowing DC power to flow to the power amplifier 30.

Figure 2A:
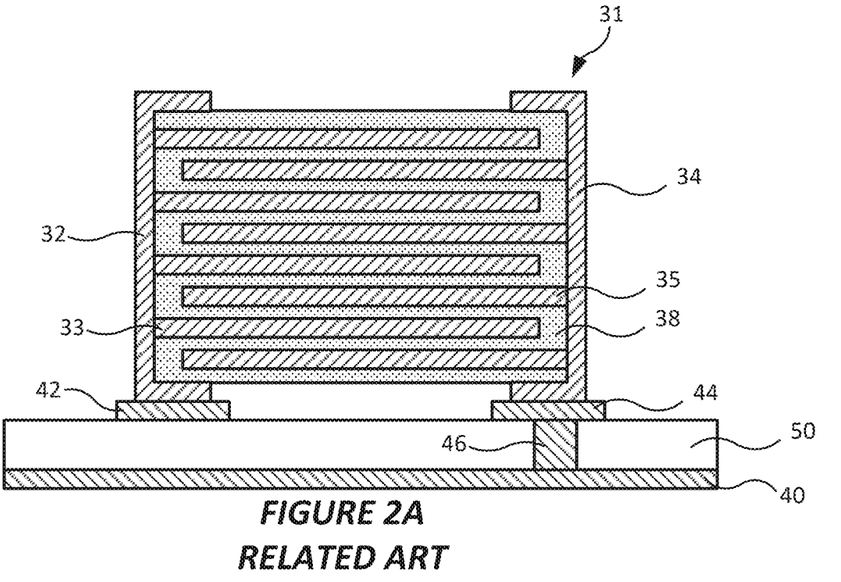
FIG. 2A is a simplified cross section of a multilayer ceramic capacitor.

A decoupling network such as the decoupling network 20 shown in FIG. 1 may be provided by a decoupling capacitor. FIG. 2A is a simplified cross section of a multilayer ceramic capacitor (MCC) 31 that may be used as a decoupling capacitor in a decoupling network. As shown therein, the MCC capacitor 31 typically includes first and second terminals 32, 34 to which capacitor plates 33, 35 are respectively connected. The capacitor plates 33, 35 are separated by a dielectric material 38. The first and second terminals 32, 34 are attached to a submount 50, such as a printed circuit board (PCB) through mounting pads 42, 44. One of the mounting pads 42, 44 may be connected through the submount 50 by a conductive via 46 to a ground plane 40.

MCC capacitors typically have a standard form factor or case size, designated by a number such as 0201, 1210, etc., which indicates the size of the device. A capacitor 31 has a capacitance determined by the geometric size and shape of the device, as well as the dielectric material 38 used therein. For example, an MCC capacitor may have a capacitance between about 0.1 pF and 10 µF.

Figure 2B:
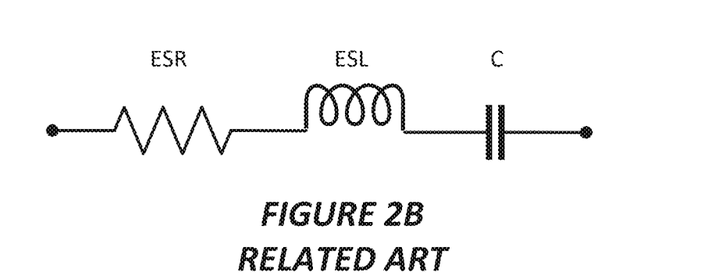
FIG. 2B illustrates an equivalent circuit of a decoupling capacitor.

In addition to having a capacitance, the capacitor 31 has a parasitic resistance and inductance due to the shape and size of the MCC capacitor itself as well as to the interconnection metals, such as the via 46, used to connect the MCC capacitor to the RF circuit. Accordingly, a decoupling capacitor 31 may be represented for purposes of modeling and analysis by the equivalent circuit shown in FIG. 2B, which includes a capacitance (C) in series with an equivalent series resistance (ESR) and an equivalent series inductance (ESL). Larger form factor devices tend to have larger values of ESR and ESL. For example, the ESR of an MCC capacitor may range from about 100 mOhm to about 1 Ohm, and the ESL of an MCC capacitor may range from about 100 pH to about 1 nH depending on form factor and implementation.

SUMMARY

A decoupling network for a radio frequency (RF) circuit according to some embodiments includes a first decoupling capacitor coupled to a decoupling node of the RF circuit, a second decoupling capacitor coupled to the decoupling node of the RF circuit in parallel with the first decoupling capacitor, and an additional resistance in series with the first decoupling capacitor or the second decoupling capacitor.

The additional resistance may be selected to reduce a resonant impedance peak of the decoupling network at a frequency between a resonant frequency of the first decoupling capacitor and a resonant frequency of the second decoupling capacitor.

The first decoupling capacitor has a first capacitance and the second decoupling capacitor has a second capacitance that may be different from the first capacitance.

The first decoupling capacitor may be configured to provide a low impedance path to RF energy in a first frequency range and the second decoupling capacitor may be configured to provide a low impedance path to RF energy in a second frequency range that may be different from the first frequency range.

The additional resistance may include an additional equivalent series resistance of the first decoupling capacitor or the second decoupling capacitor.

The additional resistance may include a discrete resistor. In some embodiments, the additional resistance may be provided by a stripline resistance, a microstrip resistance, a coplanar resistance, a biplanar resistance, and/or a wire resistance.

The additional resistance may include a first additional resistance in series with the first decoupling capacitor, and the decoupling network may further include a second additional resistance in series with the second decoupling capacitor.

The second additional resistance may include an additional equivalent series resistance of the second decoupling capacitor. The second additional resistance may include a discrete resistor. The additional resistance may be between 500 mOhm and 1500 mOhm.

The decoupling network may further include a third decoupling capacitor connected to the decoupling node in parallel with the first decoupling capacitor and the second decoupling capacitor.

A decoupling network for a radio frequency (RF) circuit according to some embodiments includes a first decoupling capacitor coupled to a decoupling node of the RF circuit, and a second decoupling capacitor coupled to the decoupling node of the RF circuit in parallel with the first decoupling capacitor. The decoupling network presents an impedance of about 1 Ohm or less for RF signals in a frequency range of about 150 kHz to about 500 MHz.

A method of forming a decoupling network for a radio frequency (RF) circuit according to some embodiments includes providing a first decoupling capacitor on a submount, wherein the first decoupling capacitor is coupled to a decoupling node of the RF circuit, providing a second decoupling capacitor on the submount, wherein the second decoupling capacitor is coupled to the decoupling node of the RF circuit in parallel with the first decoupling capacitor, and providing an additional resistance on the submount in series with the first decoupling capacitor or the second decoupling capacitor.

DETAILED DESCRIPTION

As discussed above, MCC capacitors may be used as decoupling capacitors for RF circuits. The impedance of an MCC capacitor is determined based on the capacitance, ESR and ESL of the device according to equation [1], and the magnitude of the impedance is given by equation [2], below.

From equation [2], |Z|=1 means that Z may be equal to +/−1, which corresponds to two frequencies, Fmin and Fmax at which the magnitude of the impedance is equal to one.

$$Z = ESR + j\left(ESL \cdot \omega - \frac{1}{C \cdot \omega}\right) \quad [1]$$

$$|Z| = \sqrt{ESR^2 + \left(ESL \cdot \omega - \frac{1}{C \cdot \omega}\right)^2} \quad [2]$$

Because the ESL typically has a smaller range of variation (100 pH to 1 nH) than the variation in capacitance (0.1 pF to 10 µF), the relative bandwidth of the capacitor is proportional to its capacitance value.

Figure 3:
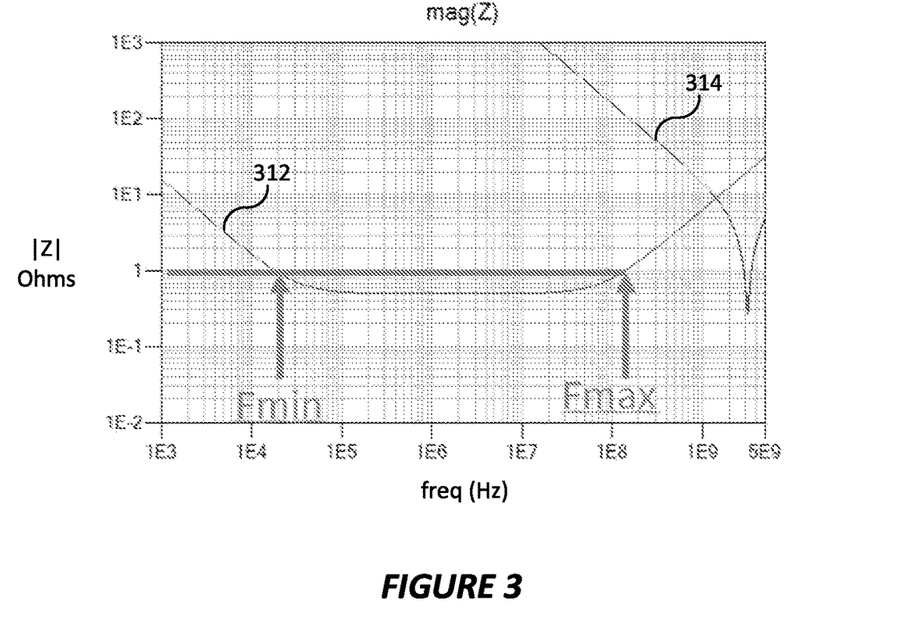
FIG. 3 is a graph that illustrates the simulated magnitude of input impedance of two different decoupling capacitors over a range of frequencies.
Figure 4:
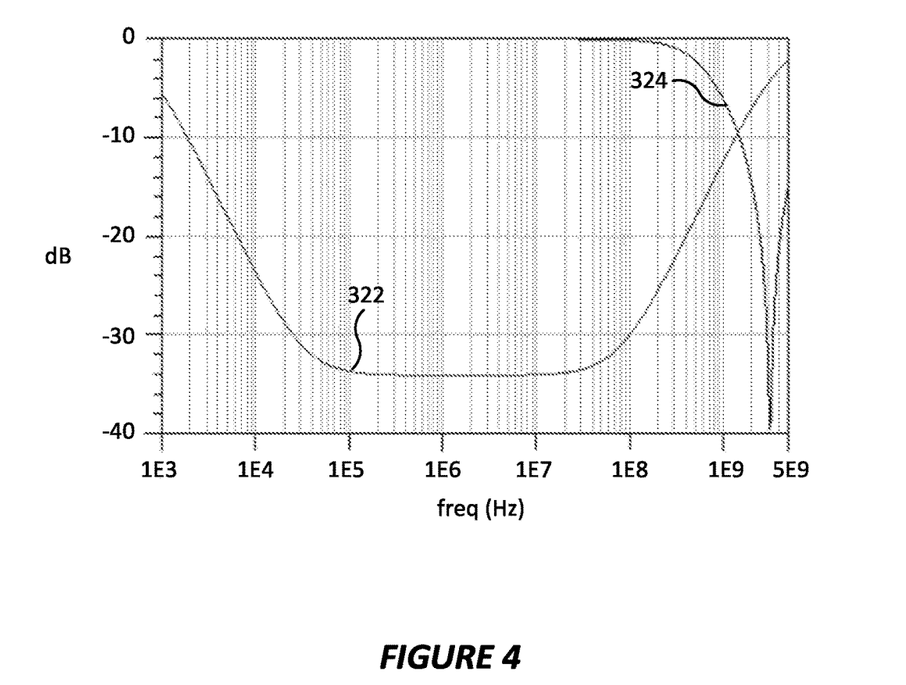
FIG. 4 illustrates simulated transmission loss curves for two decoupling capacitors.

FIG. 3 is a graph that illustrates the simulated magnitude of input impedance of two different MCC capacitors over a range of frequencies from 1 kHz to 5 GHZ, and FIG. 4 illustrates simulated transmission loss curves for both MCC capacitors. Referring to FIG. 3, curve 312 illustrates the input impedance of a 10 µF MCC capacitor having ESL=1 nF and ESR=500 Ohm, and curve 314 illustrates the input impedance of a 10 pF MCC capacitor having ESL=250 pF and ESR=250 Ohm. In FIG. 4, curve 322 illustrates the transmission loss (in dB) of a transmission line to which the 10 pF MCC capacitor is coupled, and curve 324 illustrates the transmission loss of a transmission line to which the 10 pF MCC capacitor is coupled.

As can be seen in FIG. 3, the 10 µF MCC capacitor (curve 312) provides an impedance of less than 1 over a bandwidth from Fmin=20 KHz to Fmax=150 MHz. The 10 pF MCC capacitor (curve 314) provides an impedance of less than 1 over a bandwidth of about 3-4 GHZ. As shown in FIG. 4, the 10 µF MCC capacitor (curve 322) provides more than 30 dB attenuation over the bandwidth from Fmin=20 KHz to Fmax=150 MHz, while the 10 pF MCC capacitor (curve 324) provides more than 30 dB attenuation over a bandwidth of about 3-4 GHz.

Figure 5A:
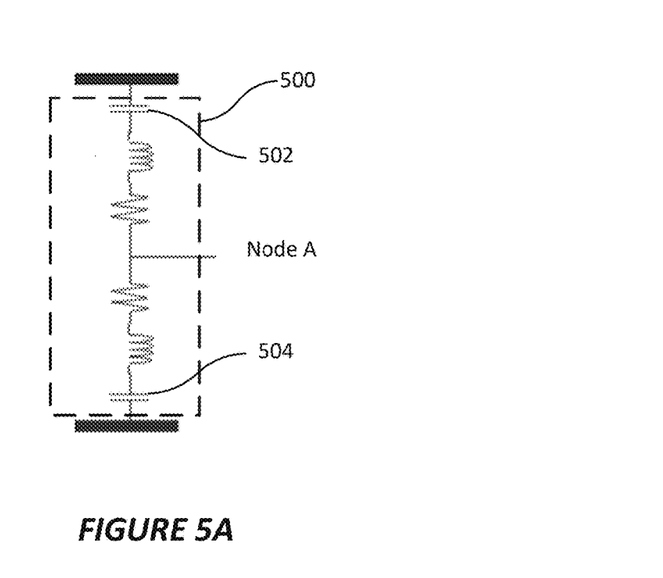
FIG. 5A illustrates a decoupling network.
Figure 5B:
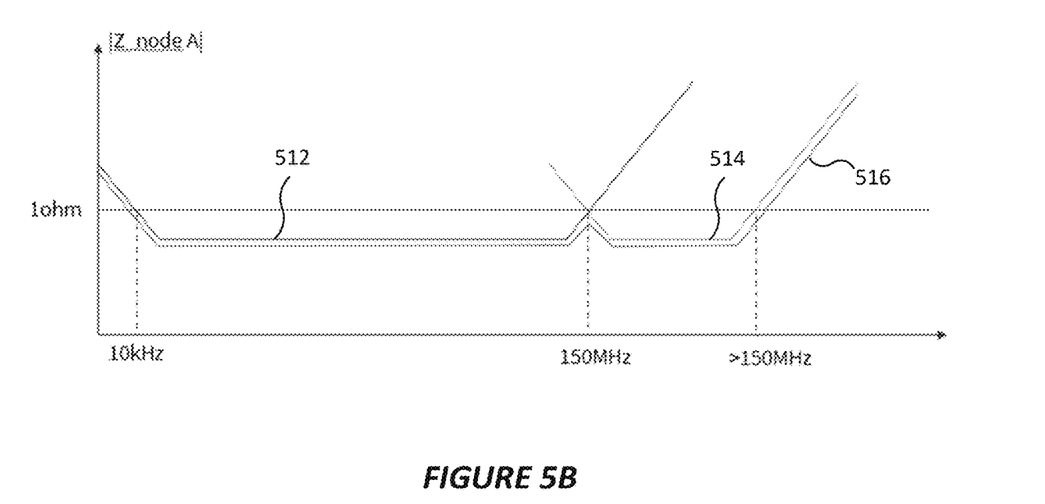
FIG. 5B is a graph illustrating the simulated impedance magnitude for a decoupling network.

To extend the effective bandwidth of a decoupling network, it is possible to simply add more decoupling capacitors having different capacitance values to a decoupling node. For example, FIG. 5A illustrates a decoupling network 500 including a first decoupling capacitor 502 and a second decoupling capacitor 504 connected to a decoupling node (node A). In the example shown in FIG. 5A, the first decoupling capacitor 502 has a capacitance of 10 µF for a bandwidth from about Fmin=10 kHz to Fmax=150 MHz. The second decoupling capacitor 504 has a smaller capacitance so that it has a bandwidth starting at Fmin=150 MHz. FIG. 5B is a graph illustrating the simulated impedance magnitude for the first decoupling capacitor 502 (curve 512) and the second decoupling capacitor 504 (curve 514). The expected graph of the impedance magnitude for the decoupling network 500 (i.e., the combination of the combined impedance of the first decoupling capacitor 502 and the second decoupling capacitor 504) is shown at curve 516.

However, as can be seen from equations [1] and [2] above, at frequencies below the resonant frequency of an MCC capacitor, the 1/Cw term dominates the impedance of the device, and so the device behaves as a capacitor. However, at frequencies above the resonant frequency of the capacitor, the ESLw term becomes larger and may eventually dominate the impedance of the device, at which point the device may begin to behave more like an inductor than a capacitor.

Figure 6A:
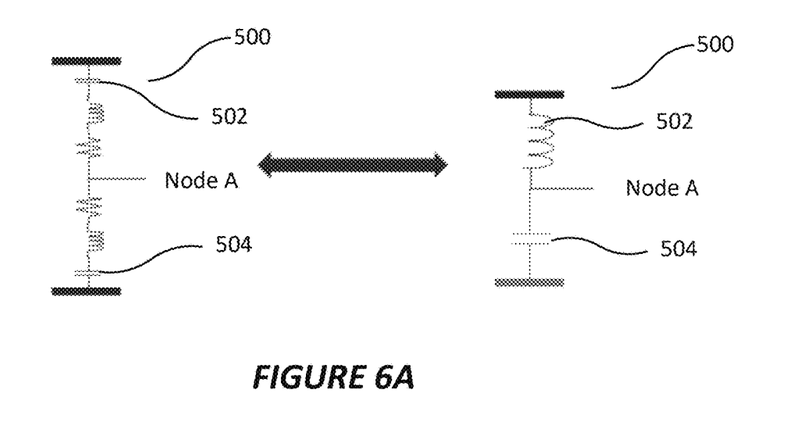
FIG. 6A illustrates a decoupling network.

Thus, as shown in FIG. 6A, at frequencies between the resonant frequencies of the first decoupling capacitor 502 and the second decoupling capacitor 504, the decoupling network 500 may begin to behave as a resonant circuit including a capacitor and inductor connected in parallel. This may result in the decoupling network appearing as an open circuit at certain frequencies rather than as a low impedance path to ground.

Figure 6B:
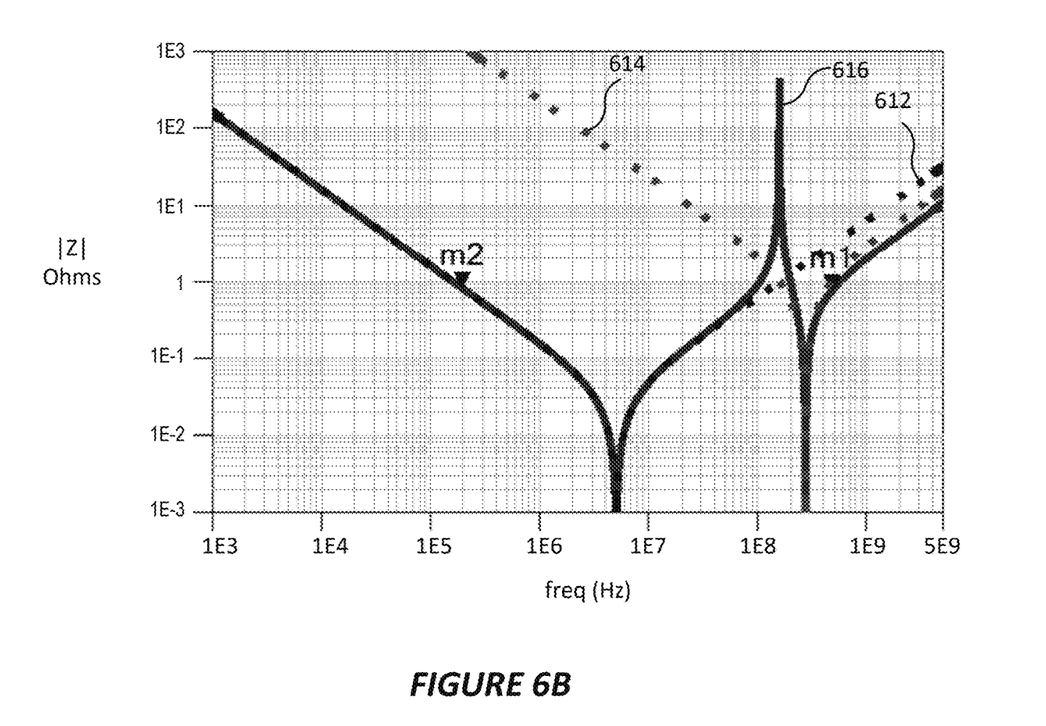
FIG. 6B illustrates simulated impedance magnitude for a decoupling network.

FIG. 6B illustrates simulated impedance magnitude for a decoupling network including a 10 µF decoupling capacitor and a 680 pF decoupling capacitor connected in parallel. The 10 µF decoupling capacitor has an ESR of 0.01 mOhm and an ESL of 1 nH, while the 680 pF decoupling capacitor has an ESR of 0.01 mOhm and an ESL of 500 pH. Curve 612 illustrates the simulated impedance magnitude of the 10 µF decoupling capacitor alone, and curve 614 illustrates the simulated impedance magnitude of the 680 pF decoupling capacitor alone. Curve 616 illustrates the simulated impedance magnitude of the decoupling network including both the 10 µF decoupling capacitor and the 680 pF decoupling capacitor. As shown in FIG. 6B, the decoupling network exhibits an undesirable impedance peak at around 150 MHz.

As explained above, in the example shown in FIGS. 6A and 6B, at a frequency of about 175 MHz, the larger 10 pF capacitor is operating above resonance, while the smaller 680 pF capacitor is operating below resonance. At this frequency, the larger 10 µF capacitor appears as an inductance due to the ESL dominating the impedance of the device, and thus the decoupling network appears to be a parallel LC circuit with a high impedance.

According to some embodiments, to avoid a resonance impedance peak when more than one decoupling capacitor is connected to a decoupling node, at least one of the decoupling capacitors may be provided with an additional resistance. The additional resistance may be provided by selecting a decoupling capacitor with a higher ESR and/or by providing a separate discrete resistor in series with the decoupling capacitor. In some embodiments, the additional resistance may be provided by providing a stripline resistance, a microstrip resistance, a coplanar resistance, a biplanar resistance, a wire resistance or other resistance in series with the decoupling capacitor. The additional resistance may decrease the quality factor Q of the decoupling circuit, which may reduce the presence of resonant impedance peaks within the bandwidth of the network.

Figure 7:
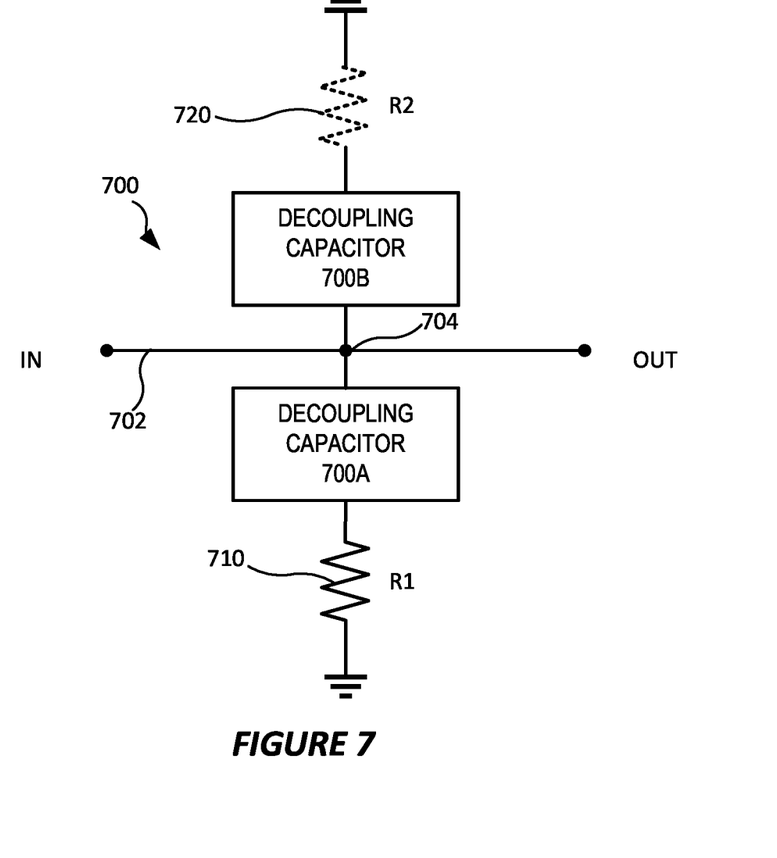
FIG. 7 illustrates a decoupling network according to some embodiments.

For example, FIG. 7 illustrates a decoupling network 700 according to some embodiments that is designed to decouple RF energy from a line 702, such as a transmission line or power supply line, at a decoupling node 704. The decoupling network 700 includes a first decoupling capacitor 700A and a second decoupling capacitor 700B connected in parallel between the decoupling node 704 and ground. An additional resistance 710 is provided in series with the first decoupling capacitor 700A. Optionally, an additional resistance 720 may be provided in series with the second decoupling capacitor 700B. The additional resistances 710, 720 may have resistance values of from about 500 mOhm to about 1500 mOhm, and in particular embodiments of about 1000 mOhm. The resistance value of the additional resistances 710, 720 may be selected to obtain a desired level of RF attenuation at a desired frequency range based on the impedances of the first decoupling capacitor 700A and the second decoupling capacitor 700B.

Figure 8:
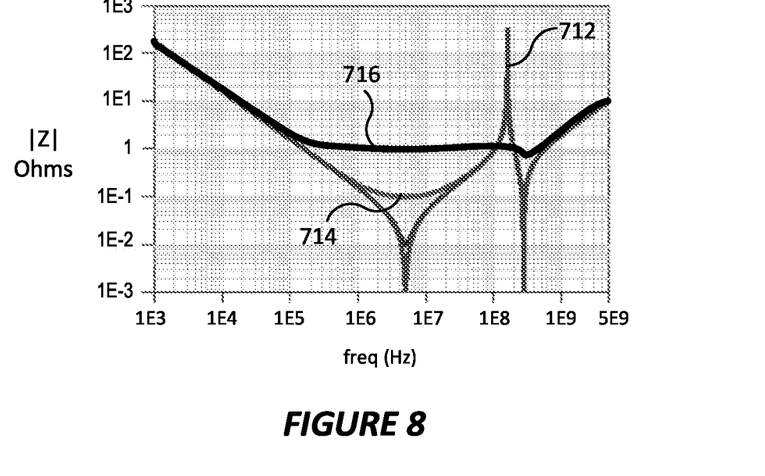
FIG. 8 illustrates the effect on the combined simulated impedance of adding an additional resistance to a decoupling network according to some embodiments.

For example, using the example above of a decoupling network including a 10 µF decoupling capacitor having an ESR of 0.01 mOhm and an ESL of 1 nH and a 680 pF decoupling capacitor having an ESR of 0.01 mOhm and an ESL of 500 pH connected in parallel, FIG. 8 illustrates the simulated effect on the combined impedance of adding an additional resistance of 1 mOhm (curve 712), 100 mOhm (curve 714) and 1000 mOhm (curve 716). As shown in FIG. 8, adding an additional resistance of 100 mOhm does not substantially reduce the impedance peak around 175 MHz. However, when an additional resistance of 1000 mOhm is added, the resonant peak goes away, and the decoupling circuit has low impedance across its entire bandwidth. As seen in FIG. 8, the resulting decoupling network presents an impedance of about 1 Ohm or less to RF signals in the range of about 150 kHz up to about 500 MHz.

Figure 9:
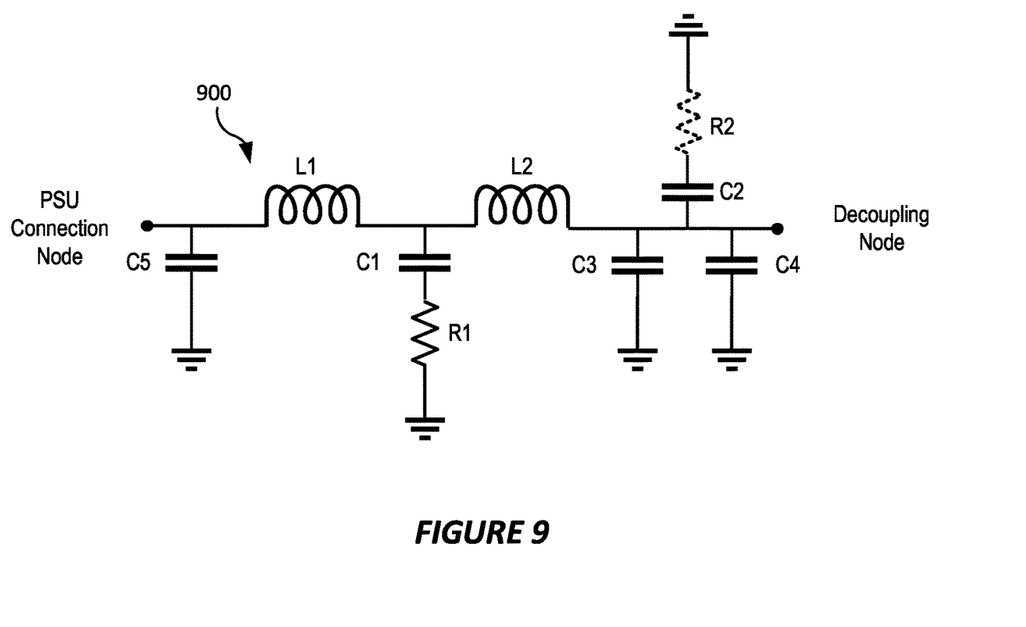
FIG. 9 illustrates a decoupling network according to some embodiments.

FIG. 9 illustrates a decoupling network according to some embodiments that may be connected, for example, between a power supply unit at a PSU connection node (or input node) and a power amplifier at a decoupling node. The decoupling network 900 includes decoupling capacitors C1 to C5 and an additional resistance R1. The largest decoupling capacitor C5 may be connected directly to the input node, and may have a capacitance of 100 µF for decoupling RF signals up to 10 kHz. Due to its bulk, C5 is connected to C1 through a long interconnect L1, which may have an inductance of about 3 nH. C1 may have a capacitance of 10 µF for decoupling RF signals from 10 kHz to 150 MHz. C1 is connected to the decoupling node through an interconnect L2 having an inductance of about 100 pH. C2, C3 and C4 may all be connected directly to the decoupling node. C2 may have an inductance of 680 pF for decoupling RF signals from 150 MHz to 500 MHz. C3 may have an inductance of 180 pF for decoupling RF signals from 500 MHz to 1 GHZ, and C4 may have an inductance of 8.2 pF for decoupling RF signals from 1 GHz to 3.5 GHz.

According to some embodiments, an additional resistance may be provided in series with one or more of the decoupling capacitors C1 to C5 to reduce a resonance peak that would otherwise exist within the bandwidth of the decoupling network 900. For example, an additional resistance R1 of 1000 mOhm may be provided in series with decoupling capacitor C1. The additional resistance may be provided in addition to an ESR of decoupling capacitor C1, or may be provided by selecting a decoupling capacitor C1 with an ESR of 1000 mOhm, so that a total resistance of the decoupling capacitor an the additional resistance R1 is 1000 mOhm.

An additional resistance may be added to one or more of the other decoupling capacitors. For example, as shown in FIG. 9, an additional resistance R2 may be added to the decoupling capacitor C2 so that the total resistance of the decoupling capacitor C2 and the additional resistor Rs is 500 mOhm.

The ESRs of decoupling capacitors C3, C4 and C5 may be about 500 mOhm, 250 mOhm, and 1000 mOhm, respectively.

Figure 10:
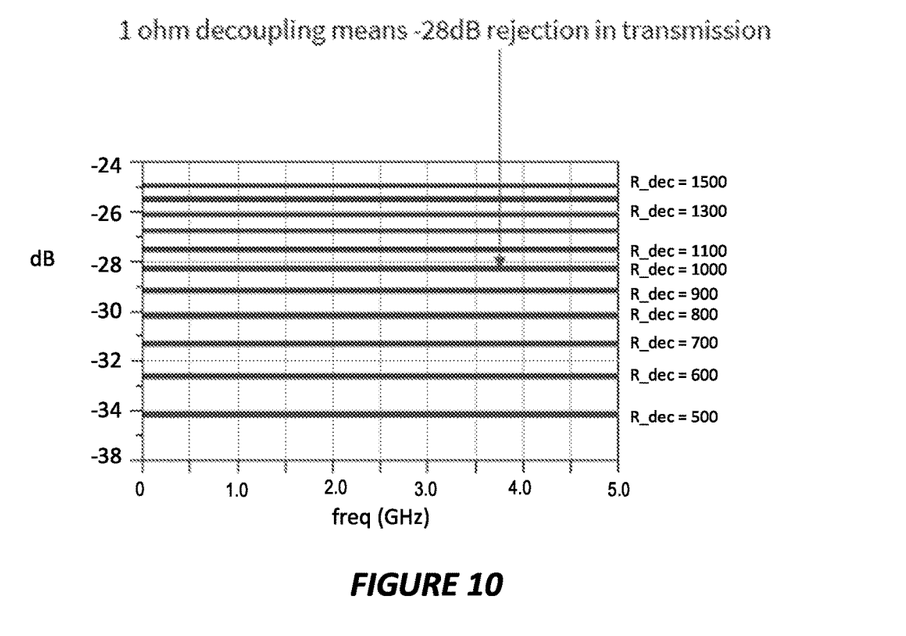
FIG. 10 illustrates results of a simulated experiment in which a decoupling network according to some embodiments is replaced with pure resistance of varying amounts

The overall ESR of the decoupling network 900 may be selected to provide a desired level of attenuation. For example, FIG. 10 illustrates results of a simulated experiment in which the decoupling network 900 is replaced with pure resistance of varying amounts, and the transmission rejection was measured across a range of frequencies. As seen in FIG. 10, a resistance of 1000 mOhm resulted in a transmission rejection of −28 dB across the entire frequency range of interest.

Figure 11:
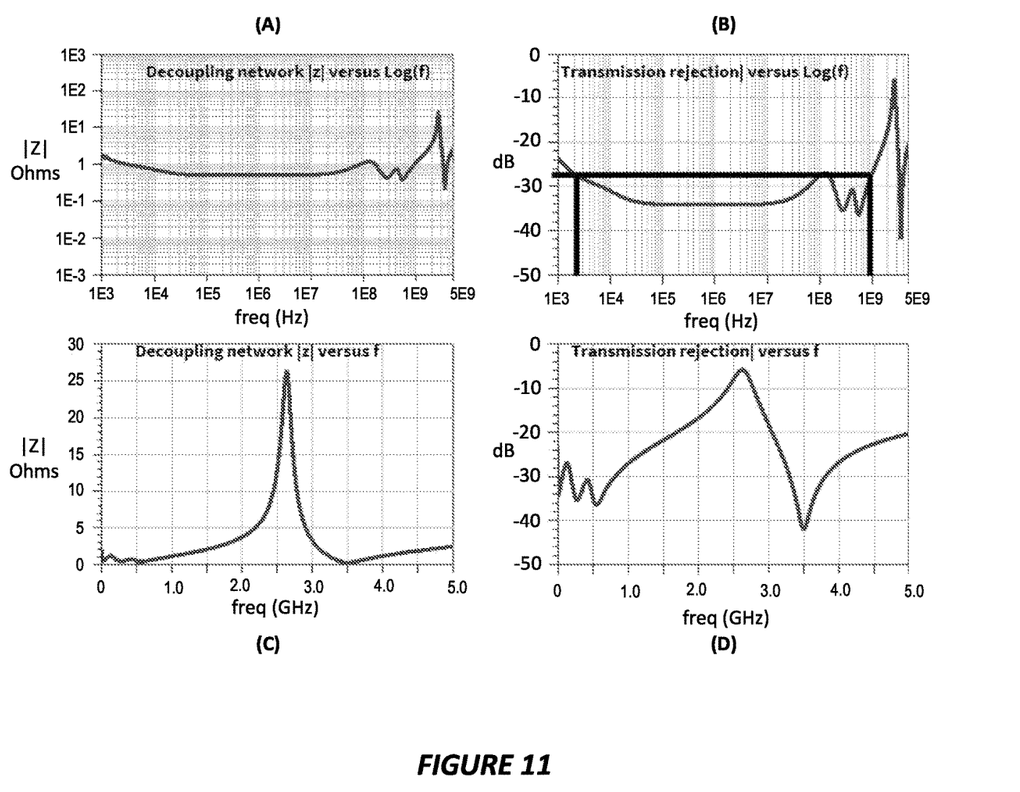
FIG. 11 illustrates the simulated impedance magnitude and transmission rejection performance of a decoupling network according to some embodiments.

FIG. 11 illustrates the simulated impedance magnitude and transmission rejection performance of the decoupling network 900 shown in FIG. 9. In particular, FIGS. 11(A) and 11(B) respectively illustrate simulated impedance magnitude and transmission rejection performance on a log frequency scale, while FIGS. 11(C) and 11(D) respectively illustrate simulated impedance magnitude and transmission rejection performance on a linear frequency scale. As seen in FIG. 11, the decoupling network provides low impedance across the entire bandwidth up to 1 GHz, with transmission rejection of at least −28 dB over the entire bandwidth up to 1 GHz.

Figure 12:
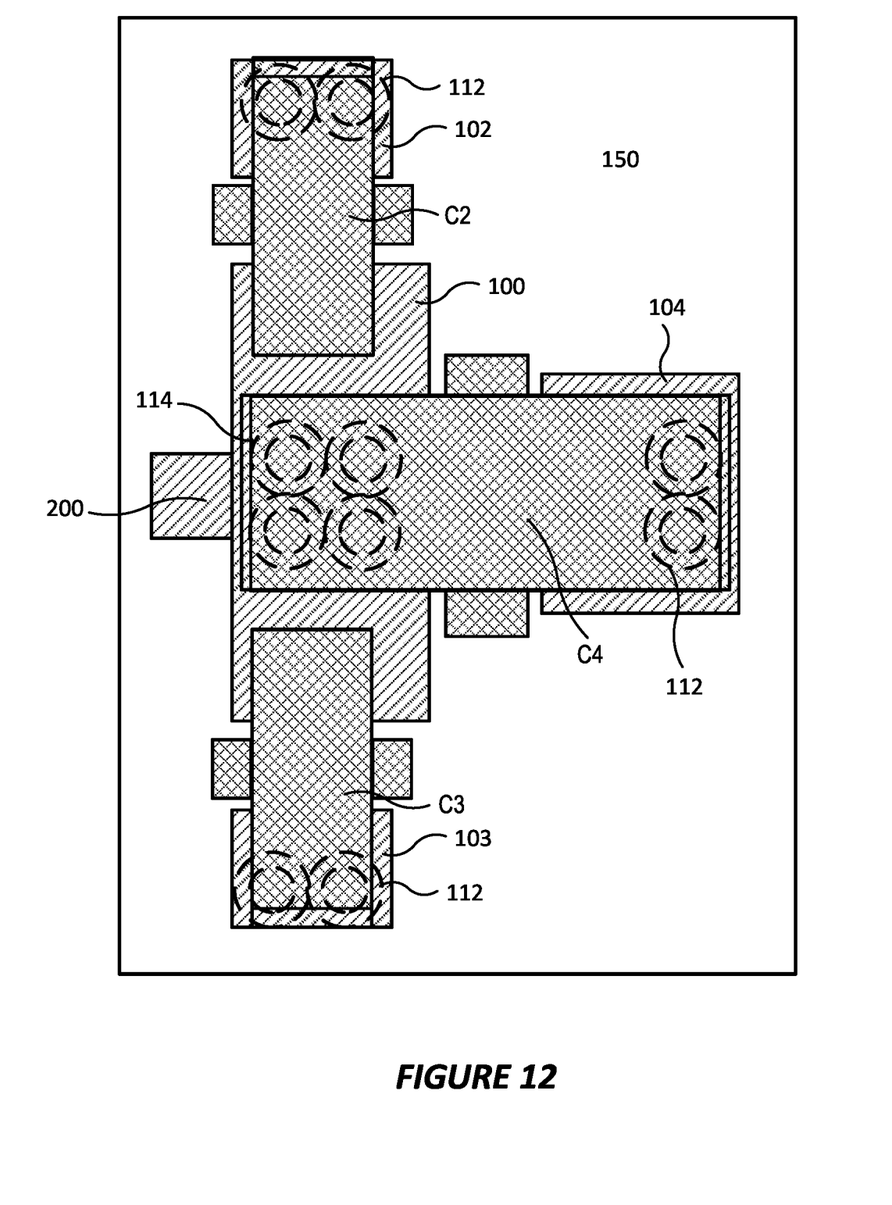
FIG. 12 illustrates a layout of capacitors of a decoupling network according to some embodiments.

FIG. 12 illustrates a layout of capacitors C2, C3 and C4 of the decoupling network 900 at the decoupling node according to some embodiments. Capacitors C2, C3 and C4 are mounted on a submount 150. Decoupling capacitors C2 and C3 may be MCC capacitors having 0201 form factors, while decoupling capacitor C4 may be an MCC capacitor having a 0402 form factor. Each of the decoupling capacitors C2, C3 and C4 has an input terminal connected to an input pad 100, which defines a decoupling plane 200. Input pad 100 is connected to capacitors C1 and C5 (FIG. 9) by interconnect vias 114. An output terminal of C2 is connected to a pad 102, an output terminal of C3 is connected to a pad 103, and an output terminal of C4 is connected to a pad 104. The output pads 102, 103 and 104 are connected to a ground plane by vias 112.

Embodiments have been described above with reference to the accompanying drawings, in which embodiments are shown. It will be appreciated, however, that the inventive concepts may, however, be embodied in many different forms and should not be construed as limited to the embodiments set forth above. Rather, these embodiments are provided so that this disclosure will be thorough and complete, and will fully convey the scope of the inventive concepts to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present inventive concepts. The term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the inventive concepts are described herein with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical embodiments and, although specific terms are employed, they are used in a generic and descriptive sense only and not for purposes of limitation, the scope of the inventive concepts being set forth in the following claims.

The invention claimed is:

1. A decoupling network for a radio frequency (RF) circuit, comprising:
    a first decoupling capacitor coupled to a decoupling node of the RF circuit;
    a second decoupling capacitor coupled to the decoupling node of the RF circuit in parallel with the first decoupling capacitor; and
    an additional resistance in series with the first decoupling capacitor or the second decoupling capacitor.

2. The decoupling network of claim 1, wherein the additional resistance is selected to reduce a resonant impedance peak of the decoupling network at a frequency between a resonant frequency of the first decoupling capacitor and a resonant frequency of the second decoupling capacitor.

3. The decoupling network of claim 1, wherein the first decoupling capacitor has a first capacitance and the second decoupling capacitor has a second capacitance that is different from the first capacitance.

4. The decoupling network of claim 3, wherein the first decoupling capacitor is configured to provide a low impedance path to RF energy in a first frequency range and the second decoupling capacitor is configured to provide a low impedance path to RF energy in a second frequency range that is different from the first frequency range.

5. The decoupling network of claim 1, wherein the additional resistance comprises an additional equivalent series resistance of the first decoupling capacitor or the second decoupling capacitor.

6. The decoupling network of claim 1, wherein the additional resistance comprises a discrete resistor.

7. The decoupling network of claim 6, wherein the additional resistance is provided by a stripline resistance, a microstrip resistance, a coplanar resistance, a biplanar resistance, and/or a wire resistance.

8. The decoupling network of claim 1, wherein the additional resistance comprises a first additional resistance in series with the first decoupling capacitor, the decoupling network further comprising a second additional resistance in series with the second decoupling capacitor.

9. The decoupling network of claim 8, wherein the second additional resistance comprises an additional equivalent series resistance of the second decoupling capacitor.

10. The decoupling network of claim 8, wherein the second additional resistance comprises a discrete resistor.

11. The decoupling network of claim 1, wherein the additional resistance is between 500 mOhm and 1500 mOhm.

12. The decoupling network of claim 1, further comprising:
a third decoupling capacitor connected to the decoupling node in parallel with the first decoupling capacitor and the second decoupling capacitor.

13. A decoupling network for a radio frequency (RF) circuit, comprising:
a first decoupling capacitor coupled to a decoupling node of the RF circuit;
a second decoupling capacitor coupled to the decoupling node of the RF circuit in parallel with the first decoupling capacitor; and
an additional resistance in series with the first decoupling capacitor or the second decoupling capacitor;
wherein the decoupling network presents an impedance of 1 Ohm or less for RF signals in a frequency range of 150 kHz to 500 MHz.

14. A method of forming a decoupling network for a radio frequency (RF) circuit, comprising:
providing a first decoupling capacitor on a submount, wherein the first decoupling capacitor is coupled to a decoupling node of the RF circuit;
providing a second decoupling capacitor on the submount, wherein the second decoupling capacitor is coupled to the decoupling node of the RF circuit in parallel with the first decoupling capacitor; and
providing an additional resistance on the submount in series with the first decoupling capacitor or the second decoupling capacitor.

15. The method of claim 14, wherein the additional resistance is selected to reduce a resonant impedance peak of the decoupling network at a frequency between a resonant frequency of the first decoupling capacitor and a resonant frequency of the second decoupling capacitor.

16. The method of claim 14, wherein the first decoupling capacitor has a first capacitance and the second decoupling capacitor has a second capacitance that is different from the first capacitance.

17. The method of claim 16, wherein the first decoupling capacitor is configured to provide a low impedance path to RF energy in a first frequency range and the second decoupling capacitor is configured to provide a low impedance path to RF energy in a second frequency range that is different from the first frequency range.

18. The method of claim 14, wherein the additional resistance comprises an additional equivalent series resistance of the first decoupling capacitor or the second decoupling capacitor.

19. The method of claim 14, wherein the additional resistance comprises a discrete resistor.

20. The method of claim 19, wherein the additional resistance is provided by a stripline resistance, a microstrip resistance, a coplanar resistance, a biplanar resistance, and/or a wire resistance.

* * * * *